United States Patent [19]

Gschwandtner

[11] 4,394,619

[45] Jul. 19, 1983

[54] HALL PROBE WITH AUTOMATIC CONNECTING MEANS

[75] Inventor: Martin Gschwandtner, Hof bei Salzburg, Austria

[73] Assignee: Vereinigte Metallwerke Ranshofen-Berndorf Aktiengesellschaft, Braunau am Inn, Austria

[21] Appl. No.: 193,667

[22] Filed: Oct. 3, 1980

[30] Foreign Application Priority Data

Oct. 5, 1979 [AT] Austria ............................. 6513/79

[51] Int. Cl.³ ..................................... G01R 19/00
[52] U.S. Cl. ............................. 324/117 H; 323/368
[58] Field of Search ................... 324/117 H, 133, 251, 324/72.5, 149; 323/294, 368; 338/32 H

[56] References Cited

U.S. PATENT DOCUMENTS 3,753,104  8/1973  Shaw ........................... 324/117 H
4,266,189  5/1981  Karlin et al. ................. 324/117 H
4,283,643  8/1981  Levin ............................... 323/368

Primary Examiner—David C. Nelms
Attorney, Agent, or Firm—Karl F. Ross; Herbert Dubno

[57] ABSTRACT

A device for measuring the current amplitude in busbars and other current feeders to the electrodes of a cell for the electrorefining of copper, comprises a Hall generator which can be set with a yoke upon the conductor or bar and which is provided with an amplifier or discriminator circuit operating a display preferably in the form of a linear array of light-emitting diodes.

6 Claims, 2 Drawing Figures

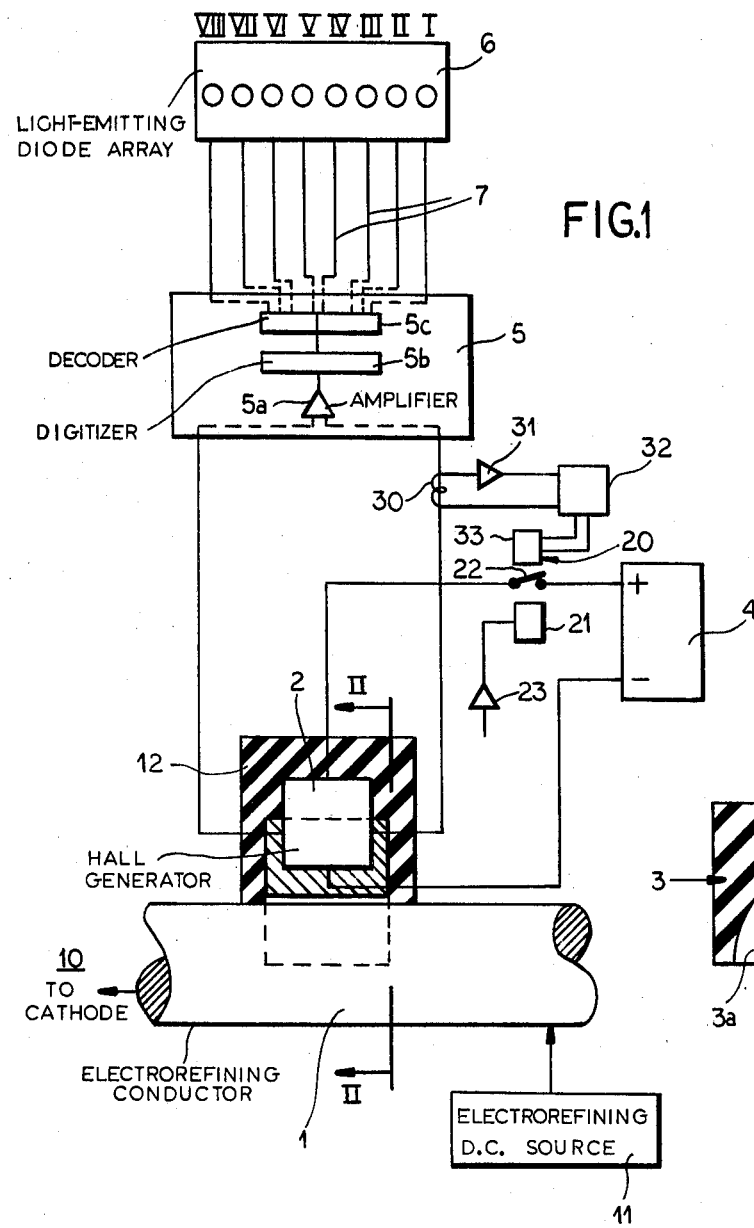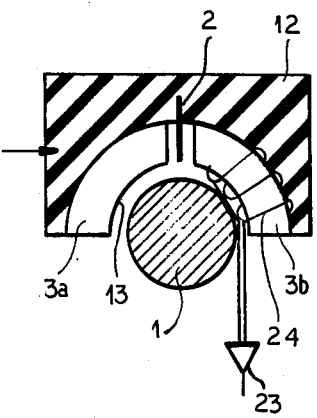

HALL PROBE WITH AUTOMATIC CONNECTING MEANS

FIELD OF THE INVENTION

My present invention relates to an apparatus or device for monitoring the electric current delivered to an apparatus for the electrorefining of copper and, more particularly, to a device for monitoring the operation of an electrolytic cell or group of cells used in the refining of copper.

BACKGROUND OF THE INVENTION

In the electrolytic refining of copper, the copper at relatively high purity is electrodeposited on cathodes in electrolytic cells from the electrolyte by a process which can be generally referred to as electrorefining.

The electrolysis is effected by direct current which can be delivered to the cathodes by cathode-carrier bars affixed to the cathode plates and forming hangers which can rest upon current-carrying rails which constitute busbars. Similar large cross-section rails or bars serve to distribute the electric current to a number of cells and within the electrorefining plant.

Experience has shown that it is desirable to maintain a substantially constant current supply to each cell and a substantially uniform or constant current distribution to all of the cells of the apparatus and that problems are encountered when the current distribution is not uniform. Uniform current distribution is essential for optimum electrical energy utilization, to minimize the specific current consumption and to ensure the production of high quality cathodes and concomitantly high purity copper.

Experience has also shown that the uniformity of the current distribution can be adversely affected in a number of ways. For example, a short circuit between cathode and anode in one cell, or the formation of a high resistance path at a contact region between the cathode and the current supply network, are just two of the several ways in which the uniformity of the current distribution can be endangered.

It is, therefore, a common practice to provide means for monitoring the current flow to one or more or all cells, such means generally comprising a galvanometer and like mechanical measuring devices which are calibrated in terms of current amplitude.

Such devices are of comparatively simple construction although experience has shown them to be highly inaccurate and unreliable.

For example, different instruments must be calibrated repeatedly and continuously and even then may not be fully reliable.

It has been difficult with such instruments to rapidly and quantitatively evaluate short circuits and bad contacts.

Efforts have been made to use thermocolor transformation techniques, comparatively labor-intensive approaches, temperature measurements for infra-red cameras, for example, the cranes provided in the plant, e.g. for transferring the cathodes. The latter approach has been associated with high investment and capital costs.

OBJECTS OF THE INVENTION

It is the principal object of the present invention to provide an improved device for monitoring the current in the electrorefining of copper and in other electrolysis systems.

Yet another object of this invention is to provide a current-measuring device which is free from the disadvantages of the art as discussed above, has no moving parts, and provides a clear readout of operating conditions.

SUMMARY OF THE INVENTION

These objects and others which will become apparent hereinafter are attained, in accordance with the present invention in a device for measuring current through, for example, a large cross-section conductor in an electrolysis plant, e.g. a busbar, current supply rail or hanger bar of a copper electrorefining cell or group of cells which includes a Hall-effect generator which is placed upon the rail and delivers an output which is processed by an amplifier and/or discriminator and displayed to indicate the current flow in intensity or amplitude.

According to a feature of the invention, the display is an array of light-emitting diodes while the discriminator responds to successive thresholds each of which corresponds to one light-emitting diode and which causes the diodes to illuminate in accordance with the detected current level.

According to another feature of the invention, the magnetic field surrounding the current-carrying bar is concentrated and applied to the Hall generator, which advantageously is of the rectangular type, by an iron yoke which can be mounted with the Hall-effect member in a common support.

It has been found to be advantageous, moreover, to cut off the current supply after a predetermined time subsequent to commencement of the monitoring operation and to provide means for turning on the voltage supply for the Hall generator when the device is applied to the conductor.

BRIEF DESCRIPTION OF THE DRAWING

The above and other objects, features and advantages of the present invention will become more readily apparent from the following description, reference being made to the accompanying drawing in which:

FIG. 1 is a circuit diagram illustrating the invention; and

FIG. 2 is a section taken along the line II—II of FIG. 1.

SPECIFIC DESCRIPTION

In the drawing I have shown a conductor 1 which can be any of the busbars and large-section current distributors in a copper electrorefining plant but, in the embodiment shown, is a cathode carrier bar which is electrically connected to the cathode as represented at 10 and is connected to a direct current source represented at 11. Around the bar 1 there is a concentric magnetic field whose field intensity is proportional to the current traversing the bar.

This magnetic field is detected by a rectangular Hall generator (see p. 24 ff. *Siemens Galvanometric Devices Data Book*, 1976, 1977, Siemens A. G. Germany) which, as is known, is supplied with a direct current from a dc source across two terminals and develops an output across the other two terminals which is proportional to the magnetic field. To concentrate the magnetic field I provide a yoke 3 of iron, the yoke here comprising a pair of segmental yoke halves 3a and 3b anchored in an insulating and non-magnetic body 12 together with the plate 2. The semicircular seat 13 is intended to straddle the current carrier bar 1.

The direct-current voltage output of the Hall generator 2, whose amplitude is proportional to the current traversing the bar 1, is applied to an electric circuit 5 which effectively is an amplifier and discriminator circuit which compares the applied signal with eight thresholds and, via conductors 7, operates the eight-stage LED display 6.

More particularly, the amplifier/discriminator 5, composed of ICs, can include an amplifier 5a which increases the analog signal amplitude and a digitizer 5b which transforms the analog signal into a bit code which at the decoder 5c is applied to the light-emitting diodes I–VIII of the array 6. The digitizer can be of the type described in chapter 11, p. 16 ff. of *Handbook of Telemetry and Remote Control*, McGraw-Hill Book Company, New York, 1967. The decoder may be any of those described in chapter 8 thereof.

The display 6 is provided with a direct amperage-reading scale and depending upon the amplitude of the current traversing the bar, one of the diodes will be illuminated. In the case of a short circuit, for example, resulting in an excessive current draw, one of the diodes VII or VIII will be illuminated.

In the case of a poor contact and thus an excessively low current, one of the diodes I or II will be illuminated. Illumination of a diode in the middle of the scale (IV or V) indicates that the current is at its optimum.

Relays 20 and 21 operate a switch contact 22 in series with the voltage supply 4. Relay 21 is energized by the amplifier 23 from a coil 24 on the yoke, the coil forming a proximity device. As the Hall generator is placed on the current carrier 1 the relay 21 is energized to automatically close switch 22 and energize the Hall generator 2. The coil 22 responds to the initial change of flux through the yoke.

The relay 21 can be a latching relay which reopens upon removal of the device from the current carrier.

Once the device is in operation, a current transformer 30 detects the initial measurement and applies its output via an amplifier 31 to a timing circuit 32 to operate a relay 33 and deenergize the Hall generator by opening switch 22 after a predetermined time.

In place of the light display 6 some other non-mechanical device may be employed. The system is preferably used in monitoring the electrorefining of copper but can be used for other electrolysis processes and for the electrowinning and electrorefining of metals as well.

I claim:

1. In an electrolysis system in which a current carrier is connected between a current source and an electrode, a device for monitoring the amplitude of the current in said carrier, said device comprising:
   a Hall generator;
   means for mounting said Hall generator on said carrier;
   a direct current source connected to said Hall generator for energizing same;
   an amplifier and discriminator circuit connected to said Hall generator and responsive to an output thereof representing a magnetic field around said carrier;
   a display connected to said amplifier and discriminator circuit for displaying the current in said carrier; and
   means for automatically connecting said source upon the mounting of said Hall generator on said carrier.

2. The device defined in claim 1, further comprising means for automatically disconnecting said source from said Hall generator upon dismounting said Hall generator from said carrier.

3. The device defined in claim 1, further comprising means for automatically disconnecting said source from said Hall generator following a predetermined time period after mounting said Hall generator on said carrier.

4. In an electrolysis system in which a current carrier is connected between a current source and an electrode, a device for monitoring the amplitude of the current in said carrier, said device comprising:
   a Hall generator;
   means for mounting said Hall generator on said carrier;
   a direct current source connected to said Hall generator for energizing same;
   an amplifier and discriminator circuit connected to said Hall generator and responsive to an output thereof representing a magnetic field around said carrier;
   an iron yoke having segments flanking said Hall generator and at least partially surrounding said carrier for concentrating said magnetic field around said carrier;
   a display connected to said amplifier and discriminator circuit for displaying the current in said carrier; and
   means for automatically connecting said source upon the mounting of said Hall generator on said carrier.

5. The device defined in claim 4, further comprising means for automatically disconnecting said source from said Hall generator upon dismounting said Hall generator from said carrier.

6. The device defined in claim 4, further comprising means for automatically disconnecting said source from said Hall generator following a predetermined time period after mounting said Hall generator on said carrier.

* * * * *